(12) United States Patent
Wu et al.

(10) Patent No.: US 9,991,440 B2
(45) Date of Patent: Jun. 5, 2018

(54) MAGNETORESISTIVE RANDOM ACCESS MEMORY CELL AND FABRICATING THE SAME

(71) Applicant: Taiwan Semiconductor Manufacturing Company, Ltd., Hsin-Chu (TW)

(72) Inventors: Kuo-Ming Wu, Zhubei (TW); Chia-Shiung Tsai, Hsin-Chu (TW); Cheng-Yuan Tsai, Chu-Pei (TW); Kai-Wen Cheng, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days. days.

(21) Appl. No.: 14/928,956

(22) Filed: Oct. 30, 2015

(65) Prior Publication Data

US 2016/0056370 A1 Feb. 25, 2016

Related U.S. Application Data

(63) Continuation of application No. 13/587,642, filed on Aug. 16, 2012, now Pat. No. 9,178,136.

(51) Int. Cl.
| | |
|---|---|
| *H01L 21/76* | (2006.01) |
| *H01L 43/08* | (2006.01) |
| *H01L 43/12* | (2006.01) |
| *G11C 11/16* | (2006.01) |
| *H01L 43/02* | (2006.01) |
| *H01L 43/10* | (2006.01) |

(52) U.S. Cl.
CPC ............ *H01L 43/08* (2013.01); *G11C 11/161* (2013.01); *H01L 43/02* (2013.01); *H01L 43/10* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 2004/0201929 A1 | 10/2004 | Hashimoto et al. | |
| 2005/0185454 A1 | 8/2005 | Brown et al. | |
| 2005/0260772 A1 | 11/2005 | Horng et al. | |
| 2007/0047153 A1 | 3/2007 | Zeltser | |
| 2007/0201265 A1 | 8/2007 | Ranjan et al. | |
| 2008/0186758 A1 | 8/2008 | Shen et al. | |
| 2008/0291584 A1 | 11/2008 | Parkin | |
| 2009/0173977 A1* | 7/2009 | Xiao | H01L 43/08 257/295 |
| 2009/0273087 A1 | 11/2009 | French et al. | |
| 2010/0007344 A1* | 1/2010 | Guo | G01R 33/098 324/260 |
| 2010/0148167 A1* | 6/2010 | Whig | B82Y 25/00 257/43 |

(Continued)

*Primary Examiner* — Robert Bachner
(74) *Attorney, Agent, or Firm* — Haynes and Boone, LLP

(57) ABSTRACT

The present disclosure provides a semiconductor memory device. The device includes a pinning layer having an anti-ferromagnetic material and disposed over a first electrode; a pinned layer disposed over the pinning layer; a tunneling layer disposed over the pinned layer, a free layer disposed over the tunneling layer and a capping layer disposed over the free layer. The capping layer includes metal-oxide and metal-nitride materials.

19 Claims, 3 Drawing Sheets

(56) References Cited

U.S. PATENT DOCUMENTS

| | | | | |
|---|---|---|---|---|
| 2010/0219491 A1* | 9/2010 | Lee | ........................ | B82Y 25/00 257/421 |
| 2011/0032644 A1* | 2/2011 | Watts | ..................... | B82Y 25/00 360/324.12 |
| 2011/0316103 A1* | 12/2011 | Uchida | .................. | B82Y 25/00 257/421 |

\* cited by examiner

MAGNETORESISTIVE RANDOM ACCESS MEMORY CELL AND FABRICATING THE SAME

CROSS-REFERENCE TO RELATED APPLICATIONS

This application is a continuation of U.S. Ser. No. 13/587,642, filed Aug. 16, 2012 by inventors Kuo-Ming Wu, et al., entitled "MAGNETORESISTIVE RANDOM ACCESS MEMORY CELL AND FABRICATING THE SAME", which is herein incorporated by reference in its entirety.

BACKGROUND

In integrated circuit (IC) devices, magnetoresistive random access memory (MRAM) is an emerging technology for next generation embedded memory devices. MRAM is a memory device including an array of MRAM cells, each of which stores a bit of data using resistance values, rather than electronic charge. Each MRAM cell includes a magnetic tunnel junction ("MTJ") cell, the resistance of which can be adjusted to represent logic "0" or logic "1." Conventionally, the MTJ cell includes an anti-ferromagnetic ("AFM") pinning layer, a ferromagnetic fixed, or pinned, layer, a thin tunneling barrier layer, and a ferromagnetic free layer. The resistance of the MTJ cell may be adjusted by changing the direction of the magnetic moment of the ferromagnetic free layer with respect to that of the fixed magnetic layer. In particular, when the magnetic moment of the ferromagnetic free layer is parallel to that of the ferromagnetic fixed layer, the resistance of the MTJ cell is low, corresponding to a logic 0, whereas when the magnetic moment of the ferromagnetic free layer is anti-parallel to that of the ferromagnetic fixed layer, the resistance of the MTJ cell is high, corresponding to a logic 1. The MTJ cell is coupled between top and bottom electrodes and an electric current flowing through the MTJ cell from one electrode to the other may be detected to determine the resistance, and therefore the logic state. However, various damages to the MTJ cell, including damage to the free ferromagnetic layer and the tunneling barrier layer during an etching in the fabrication, result in poor performance of the MTJ cell. Accordingly, it would be desirable to provide an improved MRAM structure and method of manufacturing thereof.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
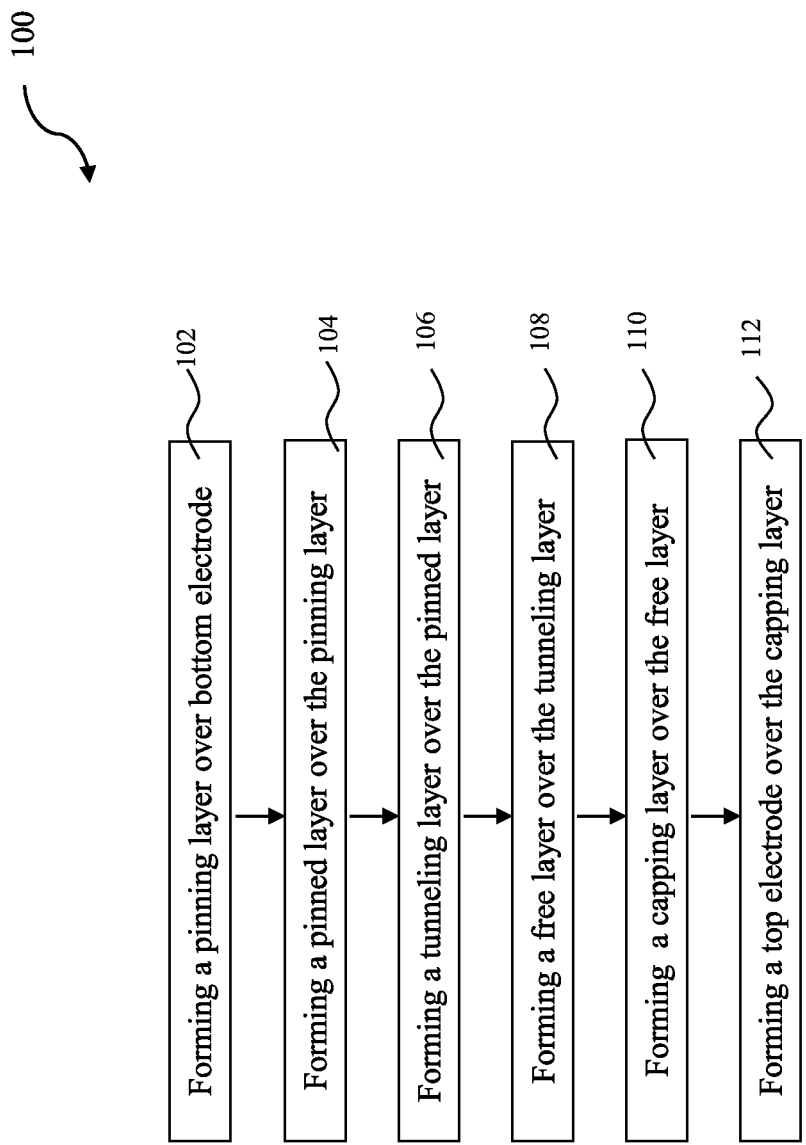
FIG. 1 is a flowchart of an example method for fabricating a semiconductor memory device constructed according to various aspects of the present disclosure.

FIG. 1 is a flowchart of a method 100 of making a semiconductor memory device constructed according to aspects of the present disclosure. For the sake of example, the method 100 will be described with reference to a semiconductor memory device 200 shown in FIG. 2. The semiconductor memory device 200 is a portion of one spin torque transfer magnetoresistive random access memory (STT-MRAM). In one embodiment, the semiconductor memory device 200 includes a stack of material layers designed and configured to function as a magnetic tunnel junction (MTJ).

The semiconductor memory device 200 is formed on a semiconductor substrate, such as silicon substrate or alternatively other suitable semiconductor substrate. The semiconductor memory device 200 includes a first electrode (or bottom electrode) 210 of conductive material. In one embodiment, the first electrode 210 includes titanium (Ti). In other embodiments, the first electrode may include other appropriate materials for forming such an electrode, such as tantalum (Ta), platinum (Pt) or ruthenium (Ru). The first electrode 210 can be formed by a physical vapor deposition (PVD or sputtering) or alternatively other suitable processes.

Figure 2:
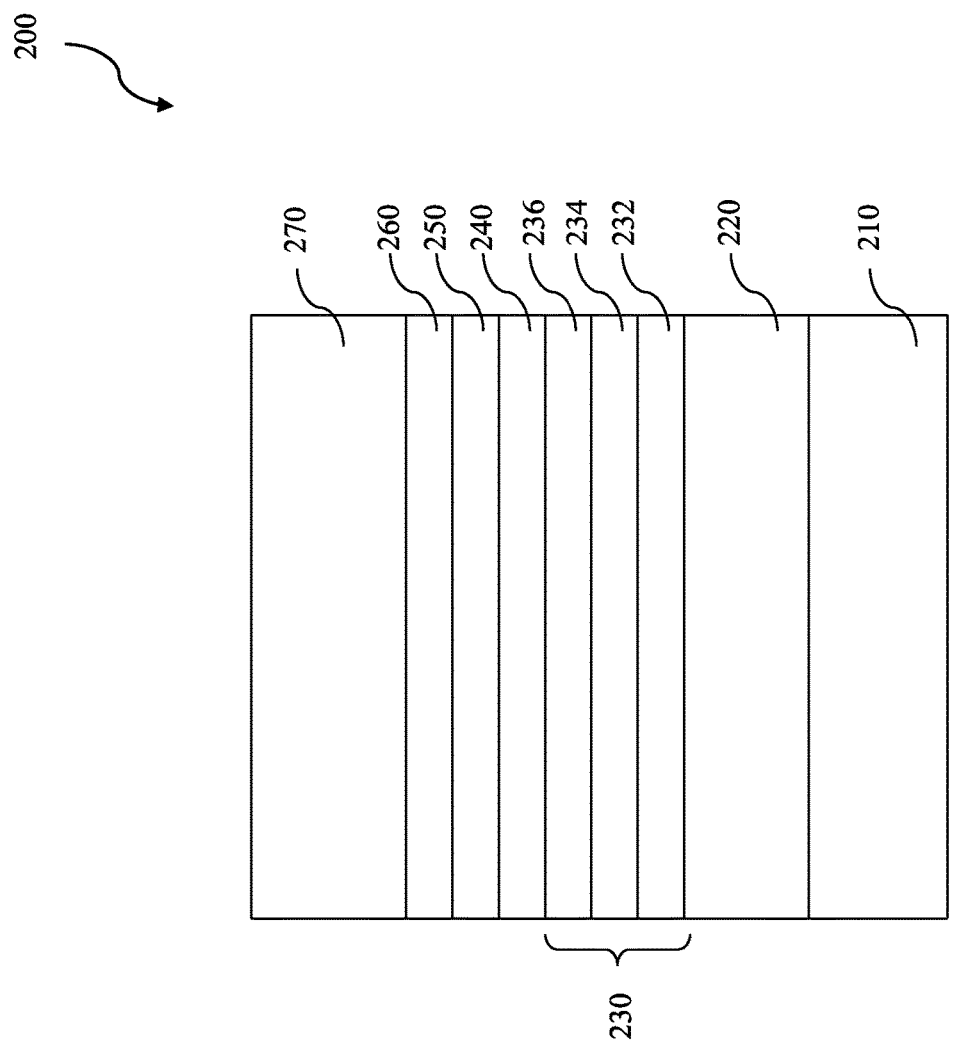
FIGS. 2 and 3 are cross-sectional views of an example semiconductor memory device at fabrication stages constructed according to the method of FIG. 1.

Referring to FIGS. 1 and 2, the method 100 begins at step 102 by forming a pinning layer 220 over the first electrode 210. In one embodiment, the pining layer 220 includes an anti-ferromagnetic (AFM) material. In an anti-ferromagnetic material, the magnetic moments of atoms or molecules align in a regular pattern with neighboring spins pointing in opposite directions. In one example, the pinning layer 220 includes platinum manganese (PtMn). In another example, the pinning layer 220 includes iridium manganese (IrMn), rhodium manganese (RhMn) and iron manganese (FeMn). In another example, the pinning layer 220 has a thickness ranging from about 100 angstrom to about 200 angstrom. The pinning layer 220 is formed by a suitable deposition technique, such as PVD.

The method 100 proceeds to step 104 by forming a pinned layer 230 over the pinning layer 220. In one embodiment, the pinned layer 230 includes a ferromagnetic material layer, such as cobalt-iron-boron (CoFeB). A ferromagnetic material can form permanent magnets and/or exhibit strong interactions with magnets. Alternatively, the ferromagnetic material may include other materials, such as CoFeTa, NiFe, Co, CoFe, CoPt, CoPd, FePt, or the alloy of Ni, Co and Fe. As one example, the CoFeB film is formed by PVD, or alternatively other suitable process.

The pinned layer 230 may include a multilayer structure. In one embodiment, the pinned layer 230 includes a first pinned layer (or bottom pinned layer) 232 and a second pinned layer (or top pinned layer) 236 interposed by a spacer layer 234. In this embodiment, the first pinned layer 232 is disposed on the pining layer 220. In furtherance of the embodiment, the first pinned layer 232 includes a ferromagnetic material. In one example, the ferromagnetic material in the first pinned layer 232 includes a CoFeB film. The ferromagnetic material layer may alternatively include other materials, such as CoFeTa, NiFe, Co, CoFe, CoPt, CoPd, FePt, or the alloy of Ni, Co and Fe.

The spacer layer 234 is disposed on the first pinned layer 232. In one embodiment, the spacer layer 234 includes ruthenium (Ru). Alternatively, the spacer layer 234 may include other suitable material, such as Ti, Ta, Cu, or Ag. The spacer layer 234 may be formed by a PVD process, or other suitable processes.

The second pinned layer 236 is disposed on the spacer layer 234. As one embodiment, the second pinned layer 236 includes a ferromagnetic material layer substantially similar to that of the first pinned layer. For example, the second pinned layer 236 includes a CoFeB film. The second pinned layer may be formed by PVD, or other alternative processing method.

In another alternative embodiment, the pinned layer 230 includes a first pinned sub-layer 232 having a first film of a first ferromagnetic material and a second film of a second ferromagnetic material on the first film of the first ferromagnetic material. The pinned layer 230 includes a spacer sub-layer 234 formed on the first pinned sub-layer 232 and a second pinned sub-layer 236 formed on the spacer sub-layer 234. The second pinned sub-layer 236 includes a third film of the first ferromagnetic material and a fourth film of the second ferromagnetic material on the third film of the first ferromagnetic material. Such a pinned layer 230 forms a synthetic AFM to provide greater exchange bias. In the illustrated embodiment, the pinned layer 230 includes a combination of a CoFeB film (the first film), CoFe (the second film), a Ru layer (the spacer layer), a CoFeB film (the third film) and a CoFe layer (the fourth film) stacked together. In one example, each of the first through the fourth films has a thickness ranging between about 10 angstrom and about 30 angstrom. Each film may have a thickness different from other films for enhanced performance of the pinned layer. However, it will be recognized that the pinned layer 230 may be implemented using other types of materials and combinations of materials appropriate for implementing a fixed ferromagnetic layer.

The method 100 proceeds to step 106 by forming a tunneling layer 240 on the pinned layer 230. The tunneling layer 240 includes magnesium (Mg). Alternatively, the tunneling layer 240 may include magnesium oxide (MgO), aluminum oxide (AlO), aluminum nitride (AlN), aluminum oxynitride (AlON), or other suitable non-magnetic material. In another embodiment, the tunneling layer 240 includes a first film of MgO and a second film of Mg over the first film, which may be formed by Mg deposition, Mg oxidation and Mg deposition. The tunneling layer 240 is thin enough such that electrons can tunnel through when a biasing voltage is applied on. In one embodiment, the tunneling layer 240 has a thickness ranging between about 5 angstrom and about 15 angstrom. The tunneling layer 240 may be formed by PVD.

The method 100 proceeds to step 108 by forming a free layer 250 on the tunneling layer 240. The free layer 250 may include a ferromagnetic material but it is not pinned because there is no anti-ferromagnetic material adjacent the free layer. Therefore, the magnetic orientation of the layer is free, thus referred to as a free layer. The free layer 250 may include a ferromagnetic material similar to the ferromagnetic material used in the pinned layer 230. As will be recognized by one of ordinary skill in the art, the magnetization direction of the ferromagnetic free layer 250 is free to rotate parallel or anti-parallel to the pinned magnetization of the pinned ferromagnetic layer 230. A tunneling current flows perpendicularly through the tunneling layer 240 depending upon the relative magnetization directions of the two ferromagnetic layers 230 and 250. In one embodiment, the free layer 250 includes a CoFeB film.

In one example, the CoFeB may have compositions expressed in $(Co_xFe_{1-x})_{80}B_{20}$, wherein the x is an alloy mole fraction and ranges between 0 and 100. The subscripts "80" and "20" are also mole fractions. In another example, the CoFeB may have compositions expressed in $Co_{20}Fe_{60}B_{20}$. The free layer 250 may be formed by a process, such as PVD. Particularly, the free layer 250 may be formed by the same PVD tool used to form other underlying layers, such as the tunneling layer 240.

The method 100 proceeds to step 110 by forming a capping layer 260 on the free layer 250. The capping layer 260 includes a thin metal-oxide or metal-nitride layer. The metal in the metal-oxide (or metal-nitride) capping layer includes beryllium (Be), magnesium (Mg), aluminium (Al), titanium (Ti), tungsten (W), germanium (Ge), platinum (Pt) and their alloy. In one embodiment, the thickness of the capping layer 260 is in a range form about 3 angstrom to about 20 angstrom. The material of the capping layer 260 is chosen in such that it has an adequate etching resistance in a subsequent etching which will be described details later. The capping layer 260 may be deposited by PVD with introducing an oxygen gas during the metal deposition to form a metal-oxide capping layer 260. Alternatively, a nitrogen gas is provided during the metal deposition and a metal-nitride capping layer 260 is formed. For an example, a metal film is formed first by sputtering and then converting it into a metal-oxide film by applying oxygen plasma. The concentration of oxygen (or nitrogen) of the capping layer 260 is predetermined by the MRMA device target of tunneling magnetoresistance (TMR) and resistance area (RA).

The method 100 proceeds to step 112 by forming a second electrode (or top electrode) 270 on the capping layer 260. The top electrode 270 includes a conductive material. The top electrode 270 may be similar to the bottom electrode 210 in terms of composition and deposition. In the depicted embodiment, the top electrode 270 includes Ta. In another embodiment, the top electrode 270 includes TaN. In yet other embodiments, the top electrode 270 may include other appropriate materials, such as titanium (Ti), platinum (Pt) or ruthenium (Ru). The top electrode 270 provides electrical connection of a device to other portions of the interconnect structure for pre-designed electrical routing. The top electrode layer 270 may be formed by a PVD process.

Figure 3:
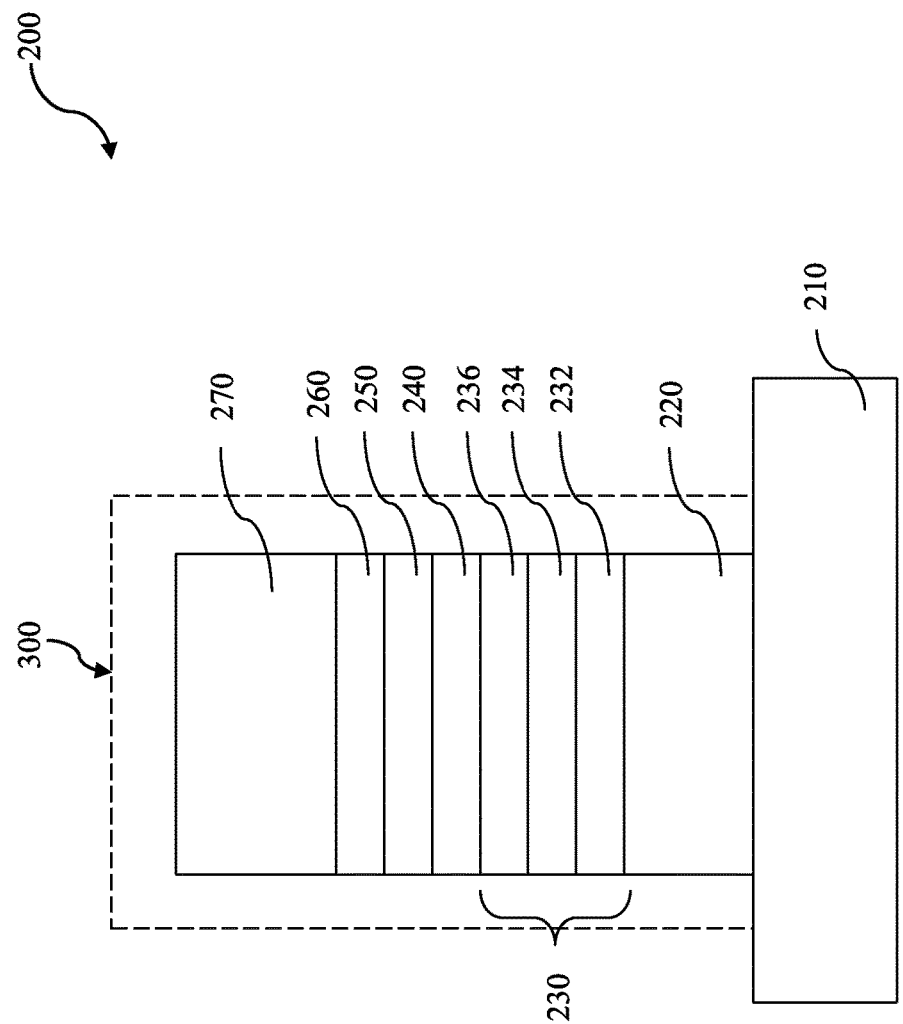

Referring to FIG. 3, a MTJ stack structure 300 in the semiconductor memory device 200 is formed by a patterning process. In one embodiment, a hard mask layer is deposited on the second electrode 270 and is then patterned by lithography and etching processes. By using the patterned hard mask as an etch mask, layers of the top electrode 270, the capping layer 260, the free layer 250, the tunneling layer 240, the pinned layer 230 and the pinning layer 220 are etched (referred to as MTJ stack etching) to form one or more MTJ stack structures 300. The MTJ stack etching includes a dry etch, a wet etch, or a combination of dry etch and wet etch. The dry etching process may implement fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr and/or CHBR3), iodine-containing gas, other suitable gases and/or plasmas, and/or combinations thereof. The MTJ stack etching may include a multiple-step etching to gain etch selectivity, flexibility and desired etch profile. The hard mask layer may be removed after the etching. In another embodiment, the hard mask remains on the MTJ stack after the etching.

With the capping layer 260 deposited on the free layer 250, improvements in critical current density (Jc), TMR and data retention of the semiconductor memory device 200 are observed. It is believed that during the MTJ stack etching, the capping layer 260, equipped with an adequate etching resistance, provides a protection to the free layer 250 and the tunneling layer 240, especially protecting them to against edge damage.

The present disclosure provides many different embodiments of a magnetoresistive random access memory (MRAM) cell that provide one or more improvements over the prior art. In one embodiment, the MRAM cell includes a pinning layer disposed over a first electrode, a pinned layer disposed over the pinning layer, a tunneling layer disposed over the pinned layer, a free layer disposed over the tunneling layer, a capping layer disposed over the free layer and a second electrode disposed over the capping layer.

Another embodiment is a magnetic tunnel junction (MTJ) stack for a magnetoresistive random access memory (MRAM) cell. The MTJ stack includes a semiconductor substrate, a first electrode formed on the semiconductor substrate, an anti-ferromagnetic layer disposed over the first electrode, a pinned disposed over the anti-ferromagnetic layer and the pinned layer having a ferromagnetic material. The MTJ stack also includes a tunneling layer disposed over the pinned layer and the tunneling layer having in a non-magnetic material. The MTJ stack also includes a free layer disposed on the tunneling layer and the free layer having ferromagnetic materials. The MTJ stack also includes a capping layer disposed over the free layer with a thickness range from about 3 angstrom to about 20 angstrom.

In yet another embodiment, a method for fabricating a MTJ stack includes forming a pinning layer over a bottom electrode, forming a pinned layer over the pinning layer, forming a tunneling layer over the pinned layer, forming a free layer over the tunneling layer and forming a capping layer over the free layer.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device comprising:
   a magnetic tunnel junction device disposed between an upper electrode and a lower electrode, wherein the magnetic tunnel junction device includes:
   a plurality of layers including a free layer having a composition of CoFeB from a top surface to a bottom surface; and
   a capping layer disposed on the plurality of layers,
   wherein the capping layer is configured to provide an etch resistance that protects a free layer and a tunneling layer of the plurality of layers of the magnetic tunnel junction device from edge damage during an etching process,
   wherein the capping layer includes at least one of: a metal nitride or a metal oxide of a metal selected from the group of beryllium (Be), tungsten (W), germanium (Ge), platinum (Pt) or their alloys, and
   wherein a concentration of at least one of: oxygen or nitrogen within the capping layer is determined by a target tunneling magnetoresistance (TMR) and resistance area (RA) of the magnetic tunnel junction device; and wherein the metal nitride or metal oxide directly interfaces a CoFeB surface of the free layer.

2. The device of claim 1, wherein the capping layer includes the metal nitride of beryllium, tungsten, germanium, or platinum.

3. The device of claim 1, wherein the capping layer has a thickness between about 3 angstroms and about 20 angstroms.

4. The device of claim 1, wherein the tunneling layer includes at least one of: magnesium, magnesium oxide, aluminum oxide, aluminum nitride, or aluminum oxynitride.

5. The device of claim 1, wherein the plurality of layers further includes:
   a pinning layer disposed on the lower electrode; and
   a pinned structure disposed on the pinning layer and below the tunneling layer.

6. The device of claim 5, wherein the pinned structure includes:
   a first ferromagnetic sub-layer;
   a spacer sub-layer disposed on the first ferromagnetic sub-layer; and
   a second ferromagnetic sub-layer disposed on the spacer sub-layer.

7. The device of claim 5, wherein the pinned structure includes:
   a first layer containing CoFeB;
   a second layer containing CoFe;
   a spacer layer containing Ru;
   a third layer containing CoFeB; and
   a fourth layer containing CoFe.

8. The device of claim 1, wherein the capping layer provides the etch resistance to an etching process that utilizes at least one of: a fluorine-containing etchant, a chlorine-containing etchant, a bromine-containing etchant, or an iodine-containing etchant.

9. The device of claim 1:
wherein the upper electrode is directly on the capping layer.

10. The device of claim 1 wherein the plurality of layers includes:
a pinning layer disposed on the lower electrode;
a pinned structure disposed on the pinning layer;
a tunneling layer disposed on the pinned structure; and
wherein the free layer is disposed on the tunneling layer.

11. The device of claim 10, wherein the tunneling layer includes at least one of: magnesium, magnesium oxide, aluminum oxide, aluminum nitride, or aluminum oxynitride wherein the CoFeB of the free layer directly interfaces the tunneling layer.

12. A semiconductor device comprising:
a semiconductor substrate;
a first electrode disposed on the semiconductor substrate;
a magnetroresistive random access memory (MRAM) cell disposed on the first electrode and comprising a free layer,
wherein the MRAIVI cell includes a capping layer disposed at an end opposite the first electrode,
wherein a composition of the capping layer provides an etch resistance that protects at least one underlying layer of the MRAIVI cell from edge damage,
wherein the capping layer includes a metal-nitride composition of beryllium or germanium and nitrogen, and
wherein a concentration of the nitrogen of the capping layer is determined by a target of tunneling magnetoresistance (TMR) and resistance area (RA) of the MRAIVI cell, wherein capping layer has a surface of the metal-nitride composition of beryllium or germanium and nitrogen that directly interfaces with the free layer; and
a second electrode disposed on the MRAIVI cell.

13. The semiconductor device of claim 12, wherein the at least one underlying layer that the composition of the capping layer protects includes the free layer and a tunneling layer.

14. The semiconductor device of claim 13, wherein the MRAM cell further includes:
a pinning layer disposed on the lower electrode;
a pinned layer disposed on the pinning layer;
the tunneling layer disposed on the pinned layer; and
the free layer disposed on the tunneling layer.

15. The semiconductor device of claim 14, wherein the pinned layer includes:
a first ferromagnetic sub-layer;
a spacer sub-layer disposed on the first ferromagnetic sub-layer; and
a second ferromagnetic sub-layer disposed on the spacer sub-layer.

16. The semiconductor device of claim 12, wherein the metal-nitride composition of the capping layer is germanium nitride.

17. The semiconductor device of claim 12, wherein the capping layer has a thickness between about 3 angstroms and about 20 angstroms.

18. The semiconductor device of claim 12, the metal nitride of the capping layer is formed directly interfacing a CoFeB surface of the free layer.

19. A semiconductor device of comprising:
a plurality of layers over a bottom electrode including a free layer including CoFeB; and
a capping layer on the plurality of layers, wherein the capping layer includes at least one of: a metal-oxide or a metal-nitride disposed directly on and directly interfacing a CoFeB surface of the free layer wherein the capping layer is a composition of a metal nitride or a metal oxide of a metal selected from the group of tungsten (W), germanium (Ge), or platinum (Pt), the metal nitride or metal oxide directly interfacing the CoFeB of the free layer;
wherein the capping layer and the plurality of layers are patterned to define a memory cell.

* * * * *